United States Patent
Jeong et al.

(10) Patent No.: US 7,675,797 B2
(45) Date of Patent: Mar. 9, 2010

(54) CAS LATENCY CIRCUIT AND SEMICONDUCTOR MEMORY DEVICE INCLUDING THE SAME

(75) Inventors: Byung-hoon Jeong, Hwaseong-si (KR); Seung-bum Ko, Hwaseong-si (KR); Jeong-suk Yang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 307 days.

(21) Appl. No.: 11/928,022

(22) Filed: Oct. 30, 2007

(65) Prior Publication Data

US 2008/0101140 A1    May 1, 2008

(30) Foreign Application Priority Data

Oct. 31, 2006 (KR) .................. 10-2006-0106720
Jul. 27, 2007 (KR) .................. 10-2007-0075942

(51) Int. Cl.
  *G11C 7/00* (2006.01)
  *G11C 8/00* (2006.01)
(52) U.S. Cl. .................. 365/193; 365/191; 365/194; 365/233.1; 365/233.11
(58) Field of Classification Search .................. 365/191, 365/193, 194, 233.1, 233.11
See application file for complete search history.

(56) References Cited

U.S. PATENT DOCUMENTS

| 6,426,900 | B1 | 7/2002 | Maruyama et al. |
| 7,027,352 | B2 | 4/2006 | Jung |
| 2002/0093871 | A1* | 7/2002 | Kwak .................. 365/233 |
| 2004/0109382 | A1* | 6/2004 | Chung et al. .................. 365/233 |
| 2005/0105377 | A1* | 5/2005 | Kim et al. .................. 365/233 |

FOREIGN PATENT DOCUMENTS

| JP | 2001-283589 A | 10/2001 |
| JP | 2004-258888 A | 9/2004 |
| KR | 1020010066128 A | 7/2001 |
| KR | 1020050041612 A | 5/2005 |
| KR | 1020070027126 A | 3/2007 |

* cited by examiner

*Primary Examiner*—Ly D Pham
(74) *Attorney, Agent, or Firm*—Volentine & Whitt, PLLC

(57) ABSTRACT

Embodiments of the invention provide a column address strobe (CAS) latency circuit that generates a stable latency signal in a high-speed semiconductor memory device, and a semiconductor memory device including the CAS latency circuit. The CAS latency circuit may include an internal read command signal generator and a latency clock generator coupled to a latency signal generator. In an embodiment of the invention, the latency signal generator outputs a stable latency signal by shifting an internal read signal output from the internal read command signal generator based on latency control clocks output from the latency clock generator.

25 Claims, 11 Drawing Sheets

CAS LATENCY CIRCUIT AND SEMICONDUCTOR MEMORY DEVICE INCLUDING THE SAME

CROSS-REFERENCE TO RELATED PATENT APPLICATION

This application claims the benefit of Korean Patent Application Nos. 10-2006-0106720, filed on Oct. 31, 2006 and 10-2007-0075942, filed on Jul. 27, 2007, in the Korean Intellectual Property Office, the disclosure of which is incorporated herein in its entirety by reference.

BACKGROUND OF THE INVENTION

1. Field of the Invention

The present invention relates to a column address strobe (CAS) latency circuit and a semiconductor memory device including the same, and more particularly, but without limitation, to a CAS latency circuit that generates a stable latency signal in a high-speed semiconductor memory device and a semiconductor memory device including the CAS latency circuit.

2. Description of the Related Art

Semiconductor memory devices are synchronized with externally-applied clocks and input/output data. Semiconductor memory devices can establish in advance which clock cycle outputs valid data after receiving a request from a controller to read data.

Column address strobe (CAS) latency is the number of external clock cycles that elapse from the time the request to read data or column address is sent to a memory device until the data is output. In other words, the memory device receives the request for data and outputs the data after a number of clock cycles defined by the CAS latency (CL).

FIG. 1 is a circuit diagram of a conventional CAS latency circuit 10 that generates a latency signal LATENCY. Referring to FIG. 1, the CAS latency circuit 10 can include at least one flip-flops 11_1 through 11_4 and at least one signal delay units 12_1 through 12_3.

The latency signal LATENCY is generated by latching an internal read command signal PREAD. Each flip-flop 11_1 through 11_4 receives a corresponding one of clock signals platclk_1 through platclk_4 at a clock input terminal. The clock signal platclk_1 through platclk_4 can be generated by delaying an output clock CLKDQ.

The CAS latency circuit 10 outputs the latency signal LATENCY when CAS latency (CL) is set to 4. The internal read command signal PREAD is input at the flip-flop 11_1 and latched by a rising edge of the clock signal platclk_1. An output signal of the flip-flop 11_1 is input to the flip-flop 11_2 and latched by a rising edge of the clock signal platclk_2. The internal read command signal PREAD is latched four times through the above process so that the CAS latency circuit 10 outputs the latency signal LATENCY.

FIG. 2 is a waveform diagram of the operation of the CAS latency circuit 10 illustrated in FIG. 1. Waveforms of an external clock CLK, an internal clock INTCLK, and a phase delay locked loop PDLL clock are illustrated in FIG. 2. The internal clock INTCLK is generated in response to a point A of the external clock CLK and delayed compared to the external clock CLK by a predetermined period of time. The phase delay locked loop PDLL clock is generated in response to a point B of the external clock CLK and a phase thereof precedes that of the internal clock INTCLK by a predetermined period of time.

A pulse width of the internal read command signal PREAD corresponds to a period of the external clock CLK. The output clock CLKDQ is generated in response to the phase delay locked loop PDLL clock and has the same frequency as the external clock CLK.

In the CAS latency circuit 10, the internal read command signal PREAD is latched by the rising edges of the clock signals platclk_1 through platclk_4 that are generated by delaying the output clock CLKDQ. However, the faster the speed of a semiconductor memory device becomes, the more the frequency of the external clock CLK increases, making a time interval between the points A and B shorter.

In order to stably output the latency signal LATENCY, the internal read command signal PREAD must be stably latched by the output clock CLKDQ and signals that are generated by delaying the output clock CLKDQ. However, the more the frequency of the external clock CLK increases, the more the margin between the internal read command signal PREAD and the output clock CLKDQ reduces. In detail, the increase in the frequency of the external clock CLK results in a reduction in the pulse width of the internal read command signal PREAD and precedence of the phase of the output clock CLKDQ to the pulse width of the internal read command signal PREAD. Since the internal read command signal PREAD is a clock domain and the output clock CLKDQ is a delay locked loop (DLL) clock domain, a skew between the two domains is influenced by a clock frequency, a surrounding pressure, temperature, or the like.

As addressed above, the internal read command signal PREAD is not properly latched due to the reduced margin between the internal read command signal PREAD and the output clock CLKDQ or the precedence of the phase of the output clock CLKDQ to the pulse width of the internal read command signal PREAD, making a proper counting based on the CAS latency (CL) impossible. Although the internal read command signal PREAD can be latched by the clock signals platclk_1 through platclk_4 that are generated by delaying the output clock CLKDQ for a predetermined period of time using the signal delay units 12_1 through 12_3 as shown in FIG. 1, there is a limit to sufficiently delaying a high frequency signal used by a high-speed semiconductor memory device.

SUMMARY OF THE INVENTION

Embodiments of the invention provide a column address strobe (CAS) latency circuit that generates a stable latency signal in a high-speed semiconductor memory device, and a semiconductor memory device including the CAS latency circuit.

The CAS latency circuit may include an internal read command signal generator and a latency clock generator coupled to a latency signal generator. In an embodiment of the invention, the latency signal generator outputs a stable latency signal by shifting an internal read signal output from the internal read command signal generator based on latency control clocks output from the latency clock generator.

An embodiment of the invention provides a CAS latency circuit that includes: an internal read command signal generator configured to generate an internal read command signal in response to a read command; a latency control clock generator configured to generate a plurality of latency control clocks, at least one of the plurality of latency control clocks having an absolute margin with respect to the internal read command signal; and a latency signal generator coupled to the internal read command signal generator and the latency control clock generator, the latency signal generator configured to receive the internal read command signal and the plurality of latency control clocks, the latency signal generator further configured to generate a latency signal by shifting the internal read command signal based on the plurality of control clocks.

Another embodiment of the invention provides a CAS latency circuit comprising: an internal read command signal generator configured to generate an internal read command signal in response to a read command; a latency control clock generator comprising a delay lock loop (DLL) configured to receive a first clock signal and generate a DLL signal, m-dividing (where "m" is an integer greater than or equal to 1) a signal obtained by controlling a phase of the DLL signal, and generating a plurality of latency control clocks based on the resulting m-divided signals; and a latency signal generator configured to receive the internal read command signal and the plurality of latency control clocks, the latency signal generator further configured to generate a latency signal based on the internal read command signal and the plurality of control clocks.

Another embodiment of the invention provides a semiconductor memory device comprising: a latency control clock generator comprising a delay lock loop (DLL) configured to receive a first external clock and generate a DLL signal, m-dividing (where m is an integer greater than or equal to 1) a signal obtained by controlling a phase of the DLL signal, and generating a plurality of latency control clocks based on the resulting m-divided signals; and a latency signal generator configured to receive an internal read command signal and the plurality of latency control clocks, the latency signal generator further configured to generate a latency signal based on the internal read command signal and the plurality of control clocks; a delay replica circuit configured to receive the DLL signal and output a delay signal obtained by delaying the DLL signal; and an output unit configured to control data output in relation to the latency signal and the delay signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
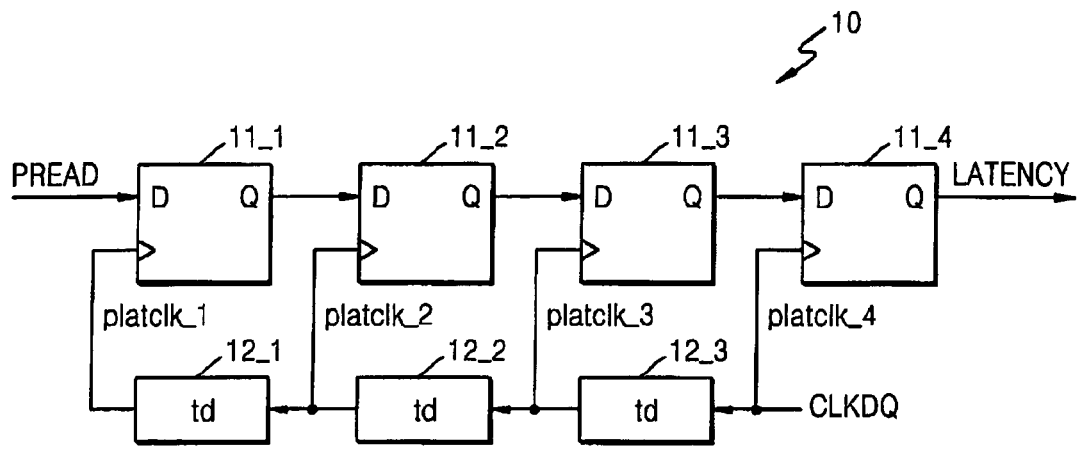
FIG. 1 is a circuit diagram of a conventional column address strobe (CAS) latency circuit that generates a latency signal.
Figure 2:
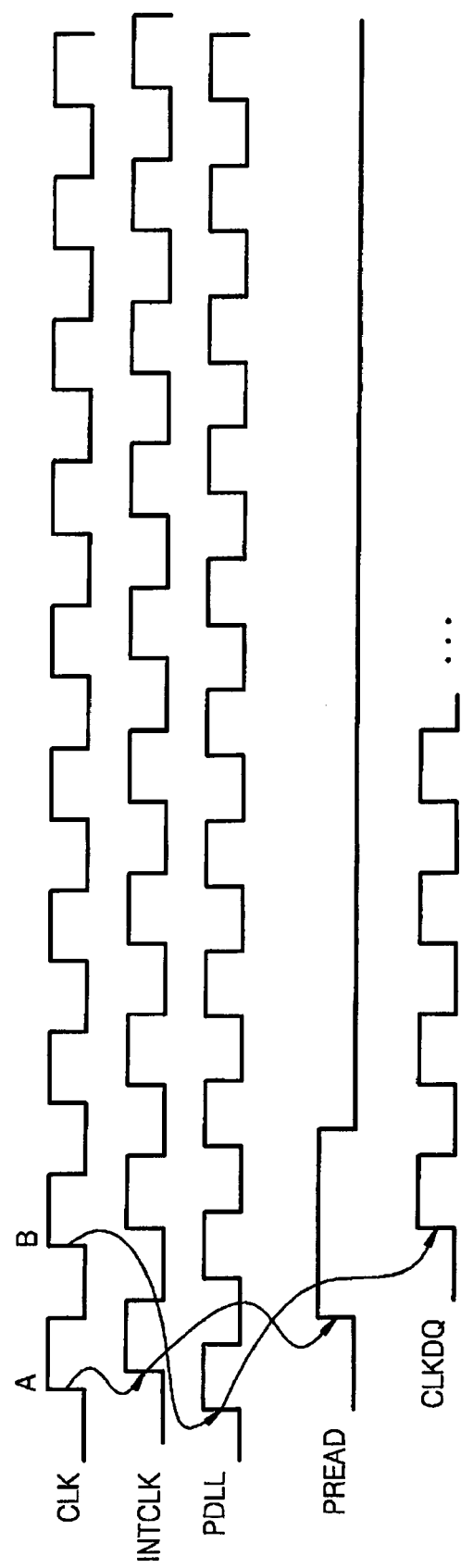
FIG. 2 is a waveform diagram of the operation of the CAS latency circuit illustrated in FIG. 1.

Hereinafter, the present invention will be described in detail by explaining preferred embodiments of the invention with reference to the attached drawings. Like reference numerals in the drawings denote like elements.

Figure 3:
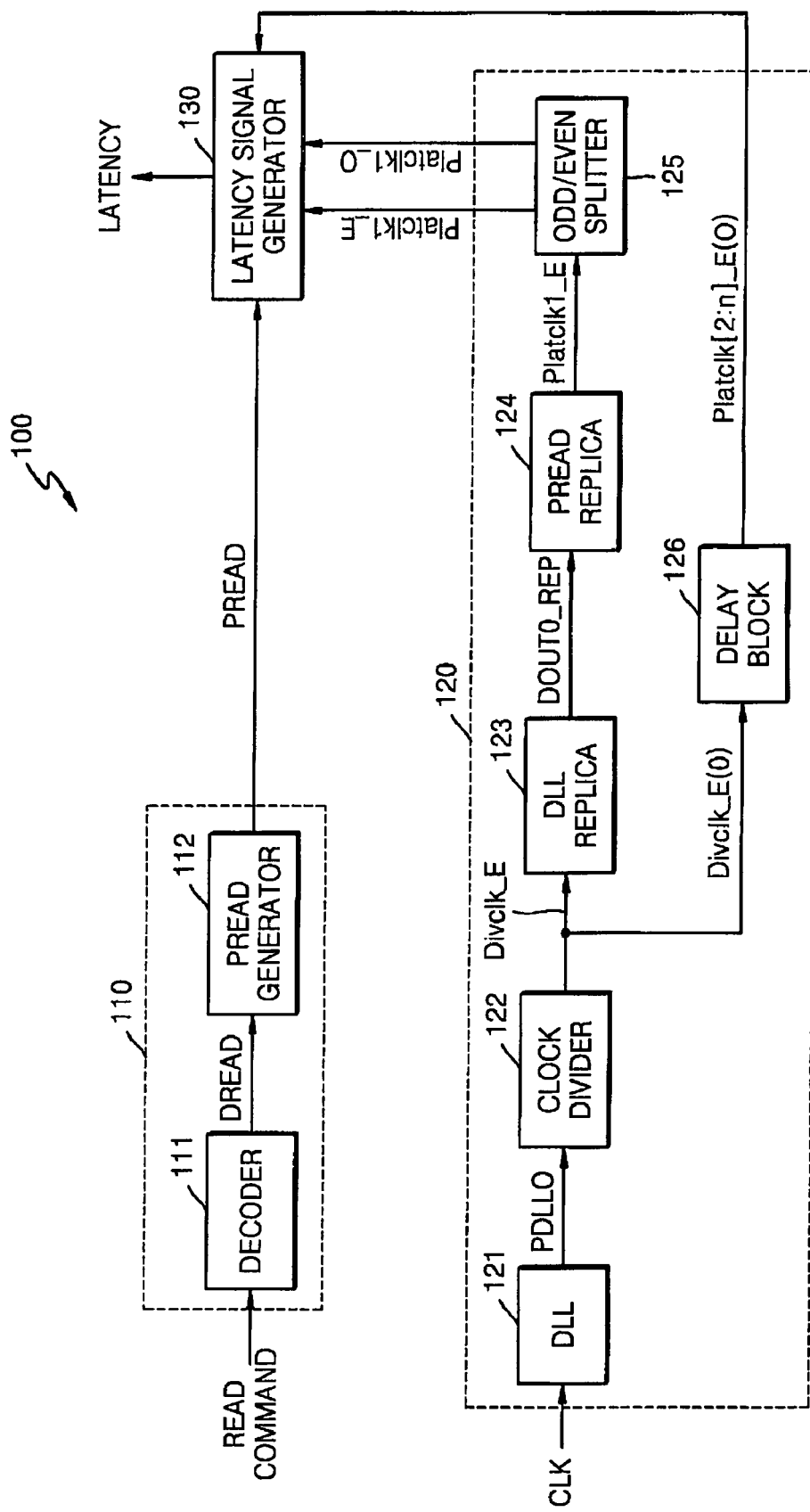
FIG. 3 is a block diagram of a CAS latency circuit, according to an embodiment of the present invention.

FIG. 3 is a block diagram of a CAS latency circuit 100 according to an embodiment of the present invention. Referring to FIG. 3, the column address strobe (CAS) latency circuit 100 includes an internal read command signal generator 110 and a latency control clock generator 120, each coupled to a latency signal generator 130.

The internal read command signal generator 110 includes a decoder 111 that receives a read command and decodes the read command, and a PREAD generator 112. The PREAD generator 112 receives a signal DREAD output by the decoder 111, generates an internal read command signal PREAD, and outputs the internal read command signal PREAD to the latency signal generator 130.

The latency control clock generator 120 generates a plurality of latency control clocks and transfers the latency control clocks to the latency signal generator 130.

The latency signal generator 130 receives the internal read command signal PREAD and the latency control clocks, shifts the internal read command signal PREAD under the control of the latency control clocks, and outputs a latency signal LATENCY (the shifted signal PREAD) that is used to control a data output.

Meanwhile, the conventional semiconductor memory device does not normally latch the internal read command signal PREAD due to the increase in the frequency of the external clock CLK or pressure, voltage, and temperature (PVT) variations. To address this problem, the latency control clock generator 120 of the present embodiment uses a PREAD replica 124 to generate latency control clocks having an absolute margin with regard to the internal read command signal PREAD. The latency control clock generator 120 also uses a clock divider 122 to output division signals having a double period of an external clock CLK in order to generate the latency control clocks.

To this end, the latency control clock generator 120 includes a delay locked loop (DLL) replica 123 and the PREAD replica 124. The latency control clock generator 120 further includes a DLL 121, the clock divider 122, an odd/even splitter 125, and a delay block 126.

The DLL 121 receives the external clock CLK and outputs a DLL signal PDLL0. The DLL signal PDLL0 is transferred to the clock divider 122. The clock divider 122 m-divides (m denotes an integer of 2 or higher) the DLL signal PDLL0 and outputs the division signals Divclk_E(O). The clock divider 122 may be a circuit that divides an input signal by 2. The division signals Divclk_E(O) may comprise an even division signal Divclk_E and an odd division signal Divclk_O, which are opposite from each other in phase.

Any one of the even division signal Divclk_E and the odd division signal Divclk_O is input into the DLL replica 123. In the present embodiment, the even division signal Divclk_E is input into the DLL replica 123. The DLL replica 123 delays the even division signal Divclk_E by a predetermined phase. In more detail, the DLL replica 123 can restore the phase of the even division signal Divclk_E varied by the DLL 121. Thus, an output signal DOUTO_REP of the DLL replica 123 is aligned to the external click CLK.

The output signal DOUTO_REP of the DLL replica 123 is input into the PREAD replica 124. The PREAD replica 124 delays the output signal DOUTO_REP of the DLL replica 123 by a predetermined phase and generates a first even latency control clock Platclk1_E. The predetermined phase depends on a phase difference between the external clock CLK and the internal read command signal PREAD. In more detail, the predetermined phase is subject to the phase difference between an edge of the external clock CLK in synchronization to which the read command is input and the internal read command signal PREAD generated by the internal read command signal generator 110. The predetermined phase may be slightly less than the phase difference between the external clock CLK and the internal read command signal PREAD.

The PREAD replica 124 transfers the first even latency control clock Platclk1_E to the odd/even splitter 125. The odd/even splitter 125 receives the first even latency control clock Platclk1_E to further generate a first odd latency control clock Platclk1_O. The first odd latency control clock Platclk1_O may have an opposite phase to the first even latency control clock Platclk1_E. The odd/even splitter 125 outputs the first even latency control clock Platclk1_E and the first odd latency control clock Platclk1_O to the latency signal generator 130.

The division signals Divclk_E(O) are input to the delay block 126. The delay block 126 can output a second latency control clock through an nth latency control clocks Platclk[2:n]_E(O) to the latency signal generator 130.

In more detail, the delay block 126 may include a first delay block that receives the even division signal Divclk_E, delays the even division signal Divclk_E, and generates a second even latency control clock through an nth even latency control clock Platclk[2:n]_E, and a second delay block that receives the odd division signal Divclk_O, delays the odd division signal Divclk_O, and generates a second odd latency control clock through an nth odd latency control clock Platclk[2:n]_O. The detailed operation of the delay block 126 will be described later.

The latency signal generator 130 receives the internal read command signal PREAD from the internal read command signal generator 110 and the first latency control clocks Platclk1_E and Platclk1_O and a second latency control clock through the nth latency control clock Platclk[2:n]_E(O) from the latency control clock generator 120. Although not shown, the latency signal generator 130 may include a first shift register unit that shifts the internal read command signal PREAD using the even latency control clock Platclk[1:n]_E and a second shift register unit that shifts the internal read command signal PREAD using the odd latency control clock Platclk[1:n]_O. Each of the first and second shift register units can comprise a plurality of shift registers.

In the CAS latency circuit 100 having the above structure, the first latency control clocks Platclk1_E and Platclk1_O generated by the latency control clock generator 120 has an absolute margin with regard to the internal read command signal PREAD. Therefore, although the frequency of the external clock CLK of a semiconductor memory device increases or pressure, voltage, and temperature (PVT) vary, the internal read command signal PREAD can be stably latched by edges of the first latency control clocks Platclk1_E and Platclk1_O. Thereafter, a delay amount of the delay block 126 is properly controlled, thereby stably performing a latch operation.

Further, since the latency control clocks Platclk[1:n]_E(O) are generated by the latency control clock generator 120 using the 2-division signals Divclk_E(O), the semiconductor memory device of the present invention can have a frequency margin two times compared to the conventional semiconductor memory device in latching the internal read command signal PREAD. For example, a DDR3-1600 third generation double data rate synchronized memory can obtain the same frequency margin as a DDR2-800 second generation double data rate synchronized memory.

Figure 4:
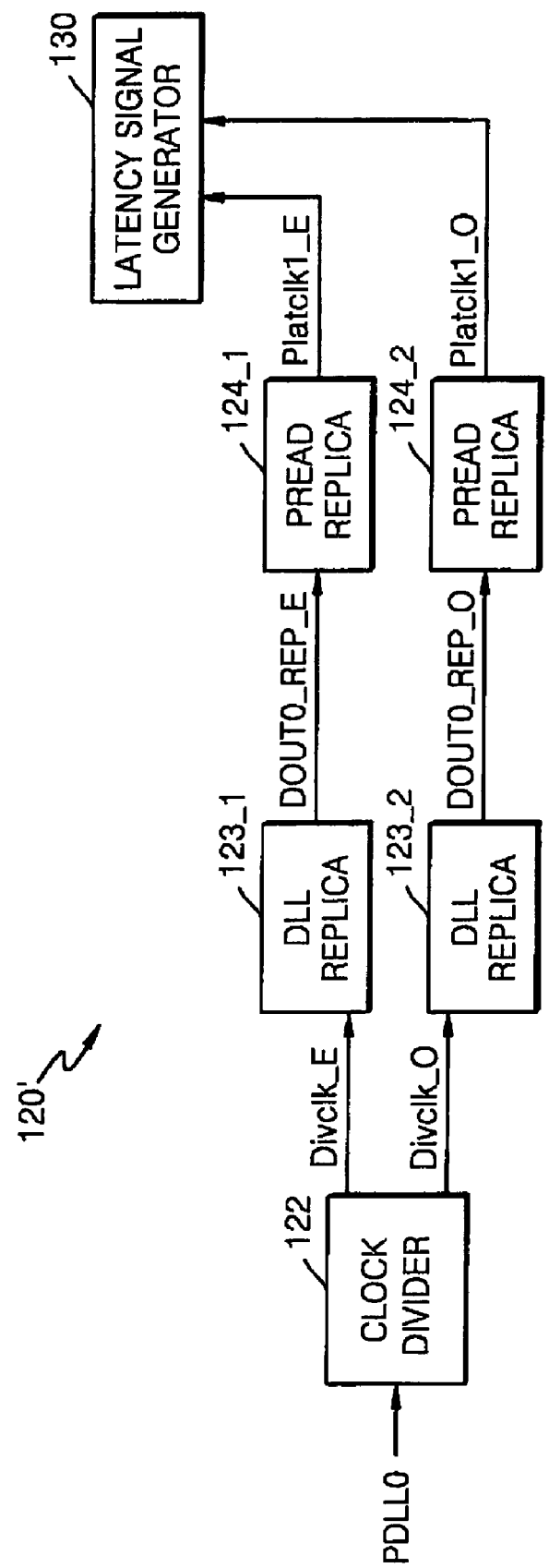
FIG. 4 is a block diagram of a latency control clock generator, according to an embodiment of the present invention.

FIG. 4 is a block diagram of a latency control clock generator, according to an embodiment of the present invention. Referring to FIG. 4, the latency control clock generator 120' includes first and second DLL replicas 123_1 and 123_2 coupled to the clock divider 122, and first and second PREAD replicas 124_1 and 124_2, but does not include an odd/even splitter 125. The latency control clock generator 120' may further include a DLL 121 (not shown) and/or a delay block 126 (not shown).

The clock divider 122 generates the 2-division signals Divclk_E(O), transfers the even division signal Divclk_E to the first DLL replica 123_1, and the odd division signal Divclk_O to the second DLL replica 123_2. An output signal DOUTO_REP_E of the first DLL replica 123_1 is input into the first PREAD replica 124_1. An output signal DOUTO_REP_O of the second DLL replica 123_2 is input into the second PREAD replica 124_2.

The first PREAD replica 124_1 delays the output signal DOUTO_REP_E by a predetermined value and generates the first even latency control clock Platclk1_E. The second PREAD replica 124_2 delays the output signal DOUTO_REP_O by a predetermined value and generates the first odd latency control clock Platclk1_O. The predetermined value is described with reference to FIG. 3 and thus its description is not repeated.

The first even latency control clock Platclk1_E and the first odd latency control clock Platclk1_O are transferred to the latency signal generator 130. The latency signal generator 130 latches the internal read command signal PREAD using the first latency control clocks Platclk1_E(O).

Figure 5:
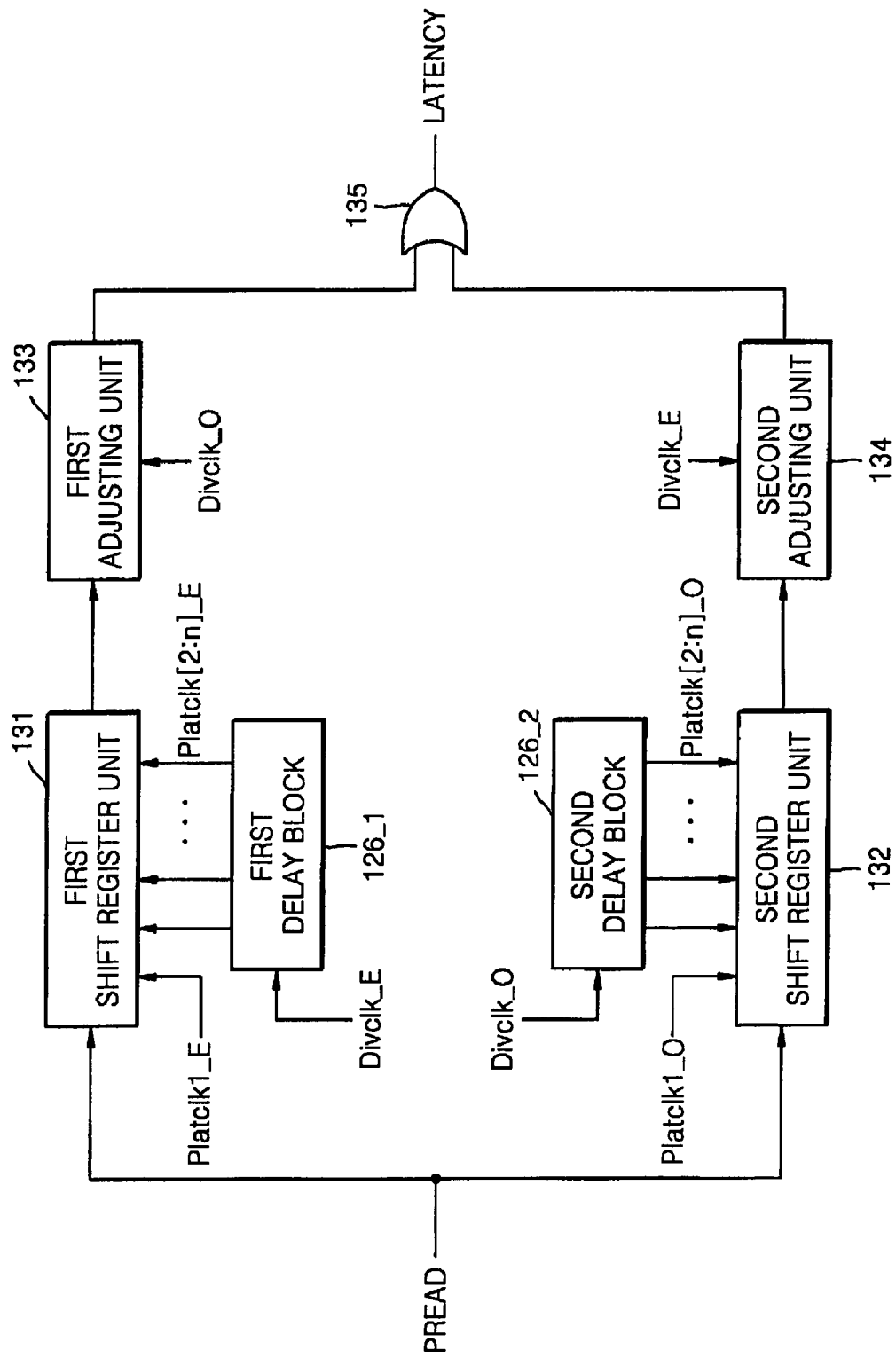
FIG. 5 is a detailed block diagram of a latency signal generator and a delay block illustrated in FIG. 3.

FIG. 5 is a detailed block diagram of the latency signal generator 130 and the delay block 126 illustrated in FIG. 3. Referring to FIG. 5, the latency signal generator 130 includes a first shift register unit 131, a second shift register unit 132, a first adjusting unit 133 coupled to the first shift register unit 131, a second adjusting unit 134 coupled to second shift register unit 132, and a logic element 135 coupled to the first and second adjusting units 133 and 134. The delay block 126 includes a first delay block 126_1 and a second delay block 126_2.

The internal read command signal PREAD is input into the first shift register unit 131 and the second shift register unit 132. The first even latency control clock Platclk1_E and the second even latency control clock through the nth even latency control clock Platclk[2:n]_E are input into the first shift register unit 131. The first delay block 126_1 receives the even division signal Divclk_E, and generates the second even latency control clock through the nth even latency control clock Platclk[2:n]_E.

The first odd latency control clock Platclk1_O and the second odd latency control clock through the nth odd latency control clock Platclk[2:n]_O are input into the second shift register unit 132. The second delay block 126_2 receives the odd division signal Divclk_O, and generates the second odd latency control clock through the nth odd latency control clock Platclk[2:n]_O.

Each of the first shift register unit 131 and the second shift register unit 132 includes a plurality of shift registers (not shown in FIG. 5). The first shift register unit 131 can include n shift registers. Each clock terminal of the n shift registers receives a corresponding one of the first even latency control clock Platclk1_E through the nth even latency control clock Platclk[1:n]_E.

When the internal read command signal PREAD is input into an input terminal of the first shift register (not shown) of the first shift register unit 131, the first shift register shifts and outputs the internal read command signal PREAD in synchronization with the first even latency control clock Platclk1_E. An output signal of the first shift register (not shown) is input into an input terminal of a second shift register (not shown) of the first shift register unit 131. The second shift register (not shown) is serially connected to the first shift register (not shown).

The second shift register (not shown) of the first shift register unit 131 shifts the input signal in synchronization with the input signal with the second even latency control clock Platclk2_E. An output signal of the second shift register (not shown) of the first shift register unit 131 is input into the input terminal of a third shift register (not shown) of the first shift register unit 131. An output signal of the nth shift register (not shown) of the first shift register unit 131 is generated through the above process.

The structure and operation of the second shift register unit 132 is similar to that of the shift register unit 131.

The first odd latency control clock Platclk1_O through the nth odd latency control clock Platclk[1:n]_O are input into each corresponding clock terminal of the n shift registers of the second shift register unit 132. Each of the n shift registers of the second shift register unit 132 is synchronized with each latency control clock, shifts the internal read command signal PREAD, and outputs the shifted PREAD signal.

The first adjusting unit 133 receives the output signal of the first shift register unit 131. If a predetermined requirement is met, the first adjusting unit 133 delays the signal by a clock of the external clock CLK and outputs the signal. For example, if the CAS latency (CL) of the semiconductor memory device is set as an odd-fold of the external clock, the first adjusting unit 133 outputs the output signal of the shift register unit 131 and transfers the output signal as the latency signal LATENCY. If the CAS latency (CL) of the semiconductor memory device is set as an even-fold of the external clock, the first adjusting unit 133 delays the output signal of the shift register unit 131 by a clock of the external clock CLK and transfers the signal as the latency signal LATENCY.

The reason is that the internal read command signal PREAD is shifted using a latency control clock having a double period compared to the external clock CLK in the present embodiment. Thus, it is necessary to further control the shifting based on a clock of the external clock CLK.

To this end, the first adjusting unit 133 includes a shift register (not shown in FIG. 5) and a logic element (e.g., an OR gate, also not shown in FIG. 5). The odd division signal Divclk_O can be input into a clock terminal of the shift register. A phase difference between a rising edge of the odd division signal Divclk_O and the even division signal Divclk_E corresponds to a clock of the external clock CLK. Finally, the delay amount of the latency signal LATENCY can be controlled.

The second adjusting unit 134 is structured and operates similarly to the first adjusting unit 133. In detail, the second adjusting unit 134 receives the output signal of the second shift register 132. If a predetermined requirement is met, the second adjusting unit 132 delays the signal by a clock of the external clock CLK, and outputs the signal. The even division signal Divclk_E can be input into the clock terminal of the shift register (not shown) of the second adjusting unit 134.

The logic element 135 can include an OR gate, and outputs one of the output signals of the first adjusting unit 133 and the second adjusting unit 134 as the latency signal LATENCY. In more detail, if the first shift register unit 131 is activated, the logic element 135 outputs the output signal of the first adjusting unit 133 as the latency signal LATENCY. If the second shift register unit 132 is activated, the logic element 135 outputs the output signal of the second adjusting unit 134 as the latency signal LATENCY.

Figure 6:
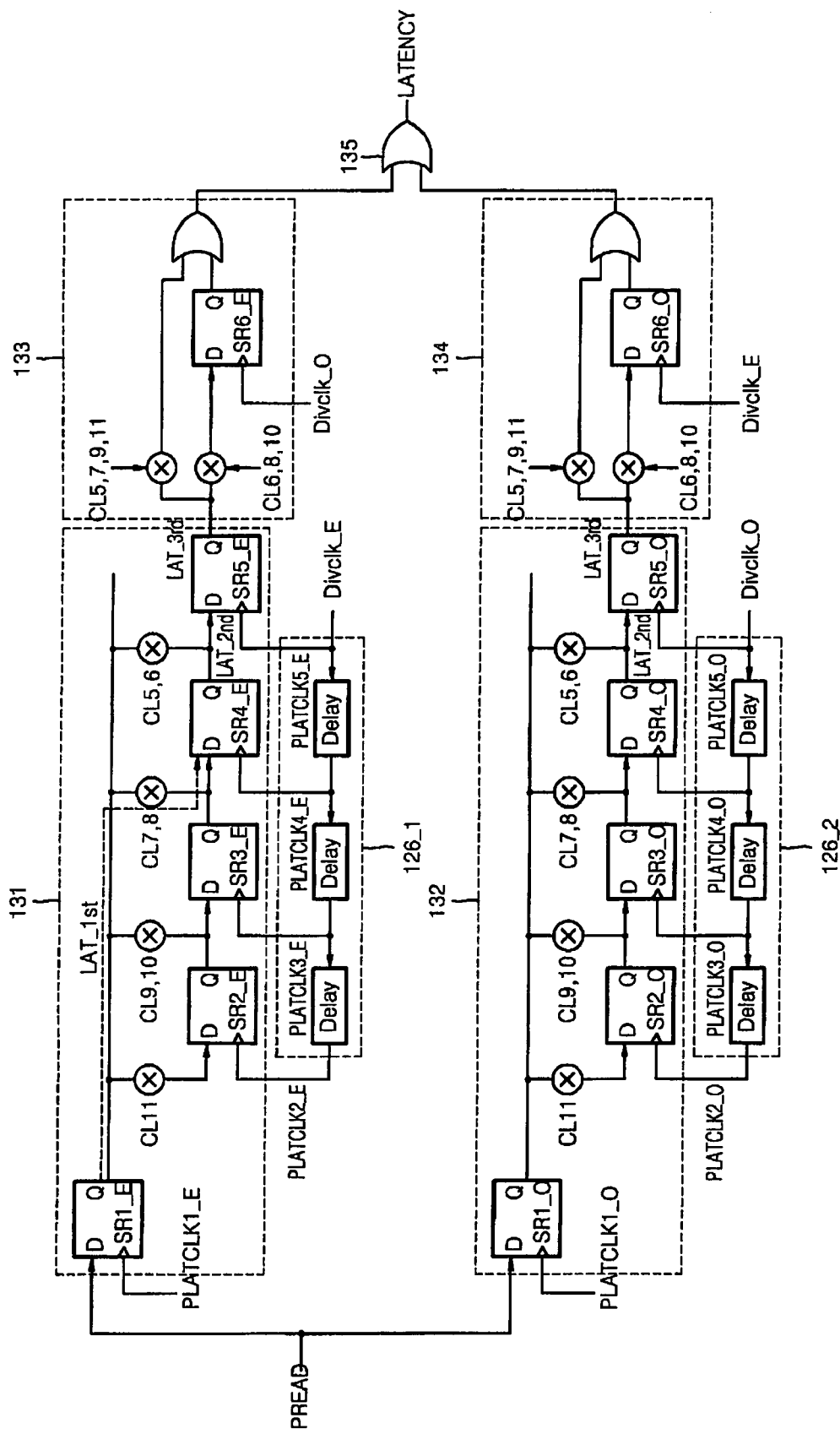
FIG. 6 is a circuit diagram of the latency signal generator and the delay block illustrated in FIG. 3.
Figure 7:
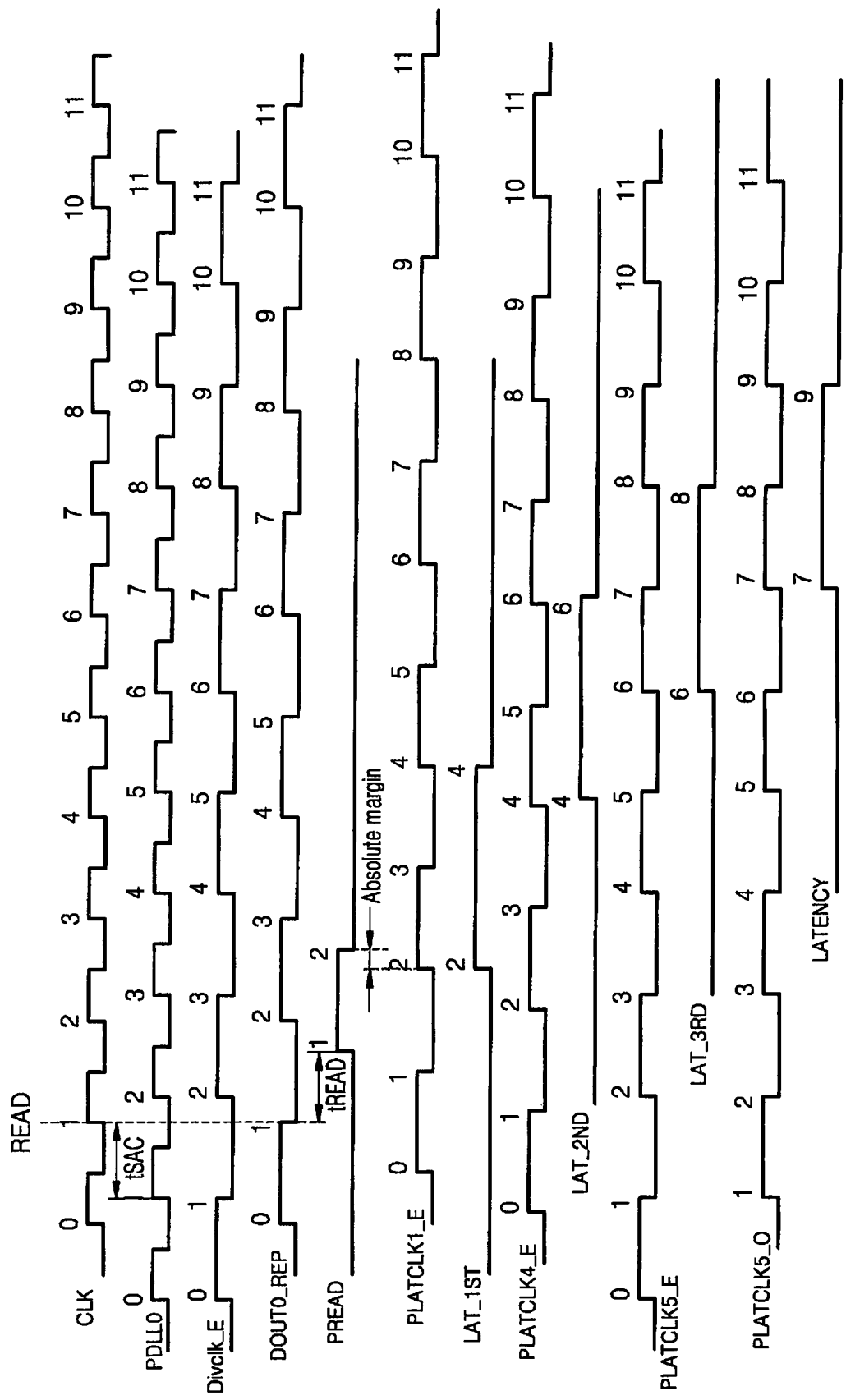
FIG. 7 is a waveform diagram of the operation of the CAS latency circuit illustrated in FIG. 3.

The detailed structure and operation of the CAS latency circuit 100 will now be described with reference to FIGS. 6 and 7. FIG. 6 is a circuit diagram of the latency signal generator 130 and the delay block 126 illustrated in FIG. 3. FIG. 7 is a waveform diagram of the operation of the CAS latency circuit 100 illustrated in FIG. 3.

Referring to FIG. 6, the latency signal generator 130 includes a first shift register 131 and a second shift register 132. The first shift register 131 includes a plurality of shift registers SR1_E through SR5_E. The second shift register 132 includes a plurality of shift registers SR1_O through SR5_O.

The first delay block 126_1 includes one or more delay elements, and generates at least one latency control clock Platclk[2:5]_E. Each latency control clock Platclk[1:5]_E is input into a corresponding one of the shift registers SR1_E through SR5_E.

For example, if the CAS latency (CL) is set as 8, an arrow-indicated signal transmission path is generated using a switch on/off control. The internal read command signal PREAD is input into an input terminal of the shift register SR1_E, and is latched by the latency control clock Platclk1_E. An output signal LAT_1st of the shift register SR1_E is input into the shift register SR4_E, and is latched by the latency control clock Platclk4_E. An output signal LAT_2nd of the shift register SR4_E is input into the shift register SR5_E, and is latched by the latency control clock Platclk5_E. An output signal LAT_3rd of the shift register SR5_E is input into the first adjusting unit 133.

The first adjusting unit 133 includes at least one switch that is on/off controlled according to a set value of the CAS latency (CL), and further includes a shift register SR6_E and a logic element (e.g., an OR gate). If the CAS latency (CL) is set as 8, the output signal LAT_3rd of the shift register SR5_E is input into an input terminal of the shift register SR6_E, and the input signal is latched by the odd division signal Divclk_O. An output signal of the shift register SR6_E is provided as the latency signal LATENCY through the logic element 135.

The second shift register unit 132 includes a plurality of shift registers SR1_O through SR5_O. Each of the odd latency control clocks Platclk[1:5]_O is input into a corresponding one of the shift registers SR1_O through SR5_O. The second adjusting unit 134 includes at least one switch that is on/off controlled according to the set value of the CAS latency (CL), and further includes a shift register SR6_O and a logic element (e.g., the OR gate). The second shift register unit 132 and the second adjusting unit 134 having the above structure operate similarly to the first shift register unit 131 and the first adjusting unit 133, and thus the detailed description thereof is not repeated.

Referring to FIG. 7, the CAS latency (CL) is set as 8. In particular, to make a read preamble possible, a substantial final latency signal LATENCY is activated after 6 CLKs from when a read command READ is input.

The read command READ is input at a point 1 of the external clock CLK. In this case, the substantial final latency signal LATENCY is activated at a point 7 after 6 CLKs of the external clock CLK.

The DLL 121 generates the DLL signal PDLL0 having a phase that precedes the external clock CLK by a time tSAC. The DLL signal PDLL0 is divided into a 2-division signal by the clock divider 122. The even division signal Divclk_E is shown in FIG. 7. Although not shown, the odd division signal Divclk_O is an inversion of the even division signal Divclk_E.

The 2-division signal is aligned to the external clock CLK by the DLL replica 123. For example, the even division signal Divclk_E is generated as the output signal DOUTO_REP through the DLL replica 123. In detail, the time tSAC is compensated by the DLL replica 123.

Whether the internal read command signal PREAD is latched by the even latency control clock or the odd latency control clock is determined the waveform of the output signal DOUTO_REP. For example, if the output signal DOUTO_REP has a rising edge at a next clock (e.g., at a point 2 of the external clock CLK) after the read command READ is input, the internal read command signal PREAD is latched by the even latency control clock. If the output signal DOUTO_REP has a falling edge at the next clock, the internal read command signal PREAD is latched by the odd latency control clock.

The output signal DOUTO_REP of the DLL replica 123 is input into the PREAD replica 124. The PREAD replica 124 receives the output signal DOUTO_REP and delays the output signal DOUTO_REP by a predetermined delay value. As described above, the predetermined delay value depends on a phase difference between the external clock CLK and the internal read command signal PREAD, and may be less than the phase difference between the external clock CLK and the internal read command signal PREAD.

Thus, an absolute margin occurs between the internal read command signal PREAD and the first even latency control clock Platclk1_E regardless of the frequency of the external clock and PVT variations, thereby stably latching the internal read command signal PREAD.

The internal read command signal PREAD is latched by the first even latency control clock Platclk1_E, and a first output signal LAT_1st is generated as shown in FIG. 7. The first output signal LAT_1st is input into the shift register SR4_E and latched by the latency control clock Platclk4_E, thereby outputting the second output signal LAT_2nd.

The second output signal LAT_2nd is input into the shift register SR5_E and latched by the latency control clock Platclk5_E. Thus, an output signal of the first shift register unit 131 is a third output signal LAT_3rd.

The third output signal LAT_3rd is input into the first adjusting unit 133. Since the internal read command signal PREAD is latched by the even latency control clock, and the CAS latency (CL) is set as 8, the third output signal LAT_3rd is input into the shift register SR6_E. The odd division signal Divclk_O can be input into a clock terminal of the shift register SR6_E.

Referring to FIGS. 6 and 7, since the even division signal Divclk_E and the latency control clock Platclk5_E have the same waveform, the odd division signal Divclk_O has the same waveform as the latency control clock Platclk5_O. Thus, an output value of the shift register SR6_E has the same waveform as the latency signal LATENCY. The final latency signal LATENCY is activated at the point 7 by 6 CLKs after the read command READ is input.

Referring to FIG. 7, the waveform shows the internal read command signal PREAD is latched by the even latency control clock. If the output signal DOUTO_REP has a falling edge at the point 2 of the external clock, the internal read command signal PREAD is latched by the odd latency control clock. A waveform showing the internal read command signal PREAD is latched by the odd latency control clock is obvious in view of the waveforms shown in FIG. 7, and thus its description is skipped.

As shown in FIG. 7, the absolute margin occurs between the internal read command signal PREAD and the latency control clock Platclk1_E. The latency control clock for latching the internal read command signal PREAD has a double period compared to the external clock CLK. Though the frequency of the external clock CLK increases or PVT vary, the internal read command signal PREAD can be stably latched, thereby outputting a stable latency signal.

Figure 8:
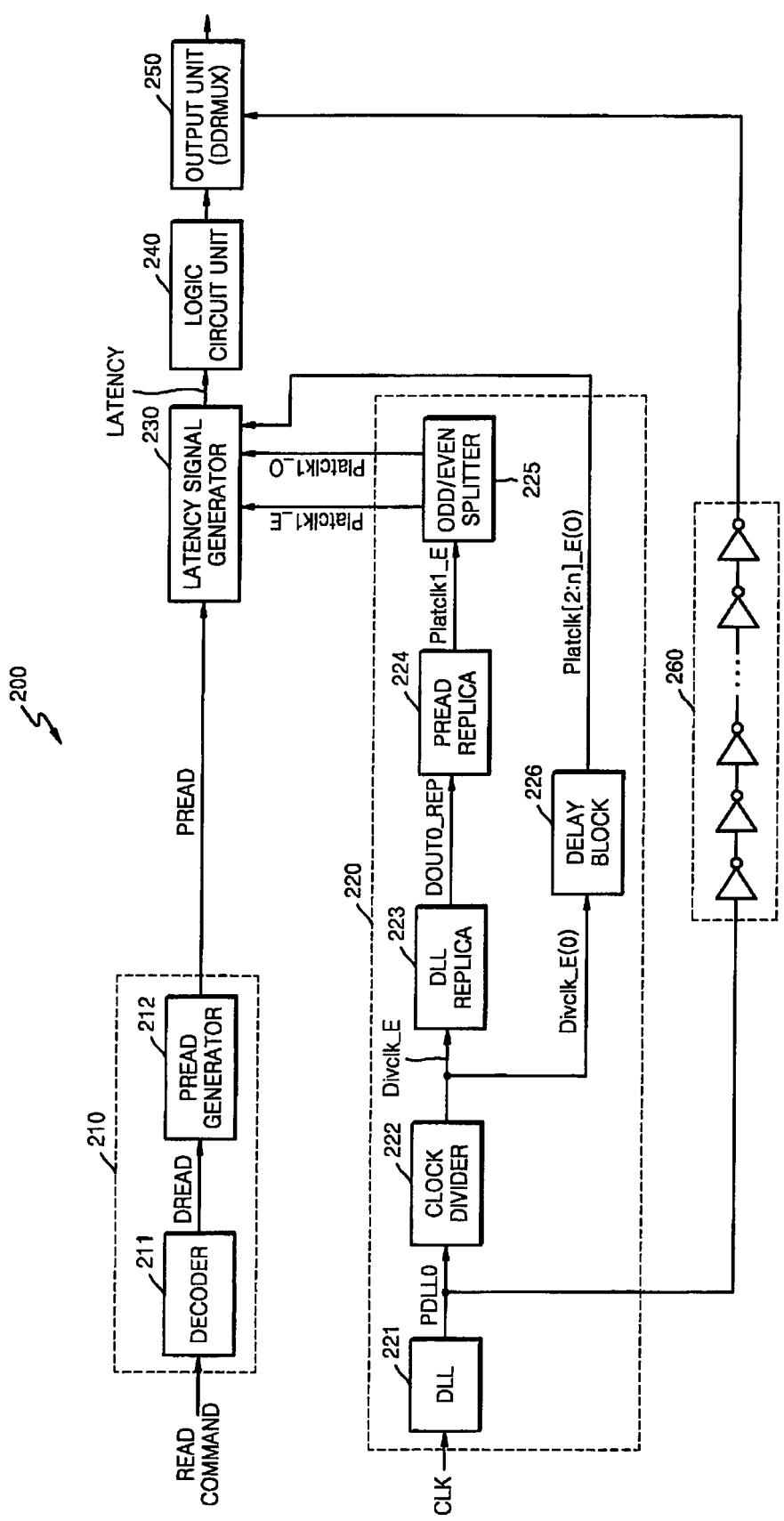
FIG. 8 is a block diagram of a semiconductor memory device according to an embodiment of the present invention.

FIG. 8 is a block diagram of a semiconductor memory device 200 incorporating a CAS latency circuit according to an embodiment of the invention. Referring to FIG. 8, a description of the exemplary circuits and their respective operation will not be repeated for elements previously discussed in relation to FIG. 3.

A latency control clock generator 220 of the semiconductor memory device 200 comprises a DLL 221 outputting a DLL signal PDLL0 which is aligned with an external click CLK.

A latency signal generator 230 receives an internal read command signal PREAD from an internal read command signal generator 210 and one or more latency control clocks Platclk[1:n]_E(O) from the latency control clock generator 220. The latency signal generator 230 shifts the internal read command signal PREAD under the control of the latency control clocks. As a latency signal LATENCY, the shifted signal is used to control a data output. The latency signal LATENCY is provided to an output unit 250 DDRMUX via a predetermined logic circuit unit 240. The output unit 250 receives the latency signal LATENCY via the logic circuit unit 240.

The output unit 250 should ensure stability of the output data even in light of possible variations in PVT. To this end, the output unit 250 synchronizes the DLL signal PDLL0 with the latency signal LATENCY. However, as shown in FIG. 8, when the latency signal LATENCY is generated based on the DLL signal PDLL0, a predetermined delay occurs in the latency signal LATENCY provided to the output unit 250 along a signal path comprising the latency control clock generator 220, the latency signal generator 230, and the logic circuit unit 240. Therefore, the semiconductor memory device 200 further comprises a delay replica circuit 260 that delays the DLL signal PDLL0 by an appropriate delay such that the DLL signal PDLL0 may be synchronized with the latency signal LATENCY in the output unit 250.

As also shown in FIG. 8, implementation of the delay replica circuit 260 may require the use of many series connected inverters. However, if the number of inverters increases, excessive current may flow through the delay replica circuit 260 or it may prove vulnerable to noise. In order to address these potential issues, embodiments of the invention may control the phase of the DLL signal PDLL0 applied to a clock divider 222 and divides the controlled DLL signal PDLL0. Although not shown in FIG. 8, the clock divider 222 may internally comprise a phase controller controlling the phase of the DLL signal PDLL0. Alternately, an external phase controller may be used in conjunction with the clock divider 222.

Figure 9A:
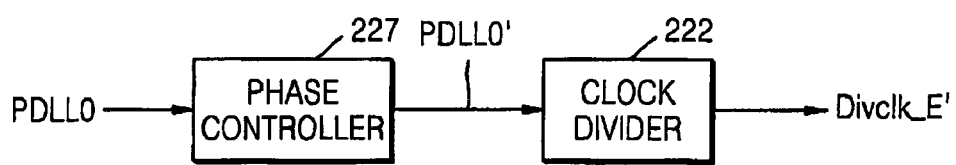
FIGS. 9A, 9B, and 9C are a block diagram, a circuit diagram, and a waveform diagram, respectively, further illustrating a portion of a latency control clock generator and signal characteristics thereof.
Figure 9B:
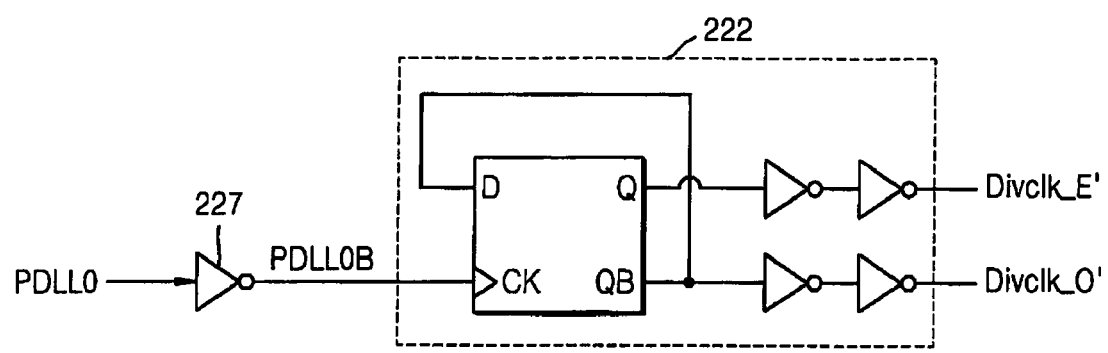

FIGS. 9A and 9B are block and circuit diagrams, respectively, of a portion of the latency control clock generator 220. Referring to FIG. 9A, the DLL signal PDLL0 is applied to a phase controller 227. The phase controller 227 outputs a signal PDLL0' having a phase that precedes that of the DLL signal PDLL0. The clock divider 222 receives the controlled signal PDLL0', divides it, and outputs the divided signal, which is an even division signal Divclk_E'. The even division signal Divclk_E' has a phase that precedes that of the even division signal Divclk_E.

Referring to FIG. 9B, the phase controller 227, implemented in the illustrated embodiment as a single inverter, receives the DLL signal PDLL0, inverts the phase of the DLL signal PDLL0, and outputs the inverted signal PDLL0B. The inverted signal PDLL0B is provided to the clock divider 222. The clock divider 222 generates two division signals Divclk_E' and Divclk_O' based on the inverted signal PDLL0B.

Figure 9C:
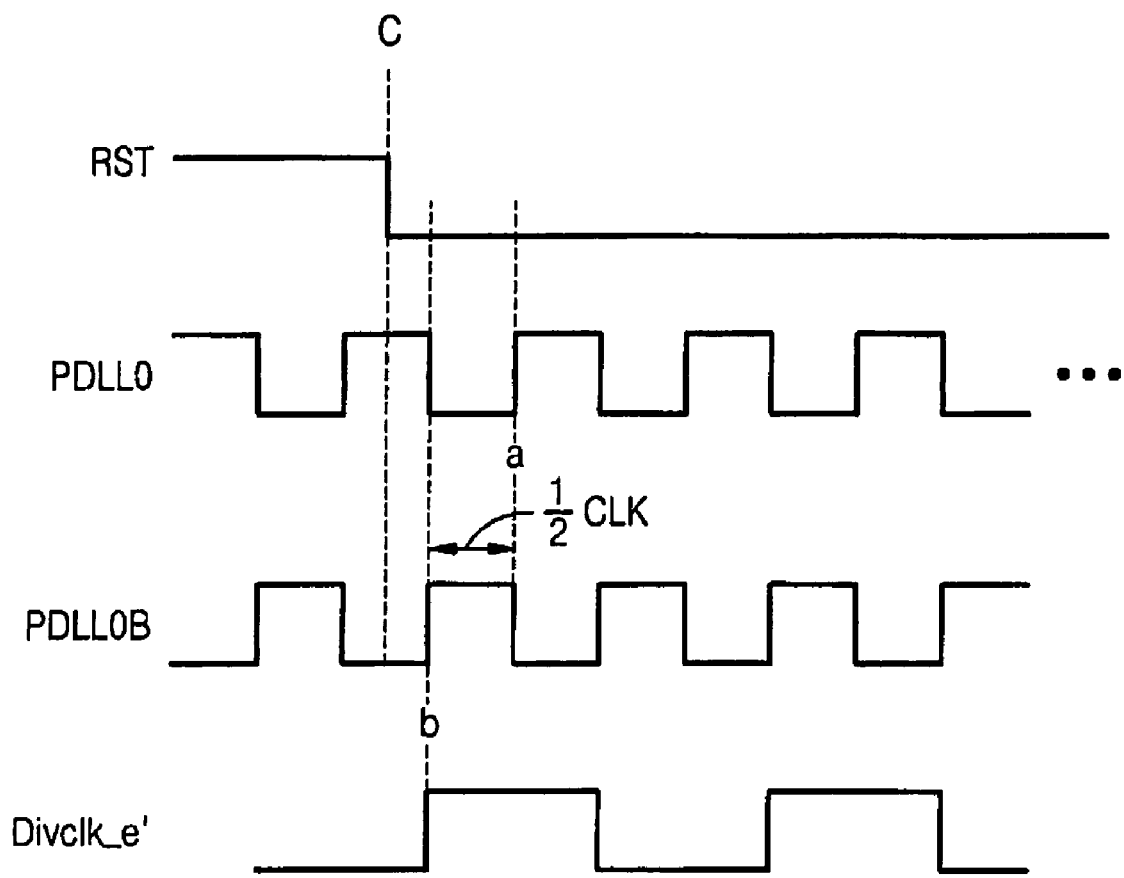

FIG. 9C is a waveform illustrating relative phases of the DLL signal PDLL0, inverted signal PDLL0B, and division signal Divclk_E. Referring to FIG. 9C, if a reset signal RST provided to a flip-flop circuit transitioning from high to low, the signal dividing operation is carried out. Assuming that phase controller 227 is implemented as a single inverter, the inverted signal PDLL0B precedes by 180° (e.g., ½ the cycle period of the external clock CLK) of the phase the DLL signal PDLL0. Therefore, the signal (division signal Divclk_E) obtained by dividing the DLL signal PDLL0 is activated at a high level (see point "a" in FIG. 9C), and the signal (division signal Divclk_E') obtained by dividing the inverted signal PDLL0B is also activated at high level (see point "b" in FIG. 9C). As a result, the division signal Divclk_E' precedes by 180° the phase the division signal Divclk_E.

Although shown in the foregoing example, it is not necessary to invert the phase of the DLL signal PDLL0 in controlling the phase of the DLL signal PDLL0. It is also possible to control the phase of the DLL signal PDLL0 in a relative relationship of greater or less than 180°. The phase of the DLL signal PDLL0 may be controlled such that the controlled signal PDLL0' transitions from low to high during the interval between points "c" and "a" in FIG. 9C.

Figure 10:
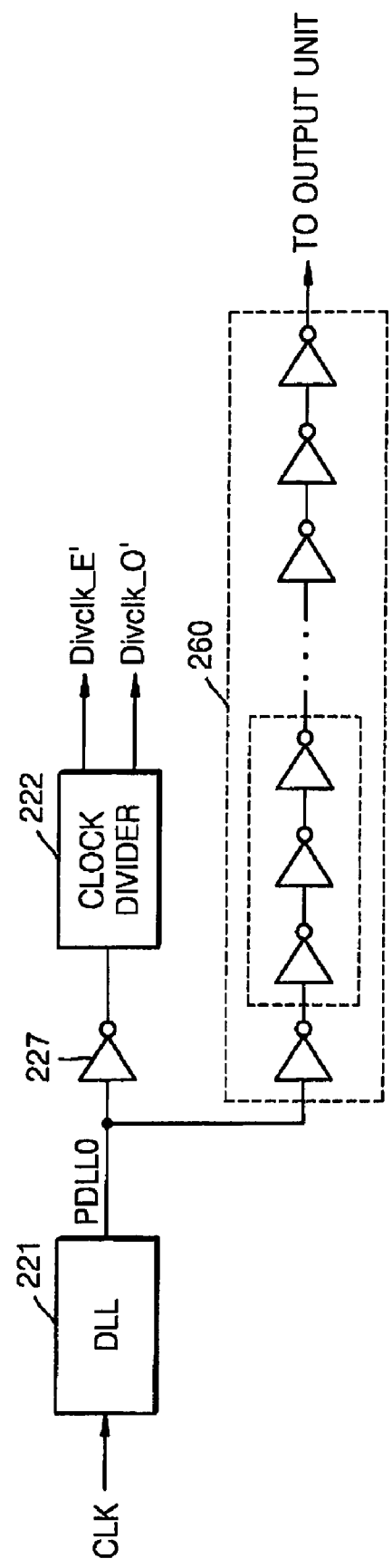
FIG. 10 is a block diagram of a semiconductor memory device and serves to further explain the reduction in the delay odds of the delay replica circuit shown in FIG. 8.

FIG. 10 is a block diagram of a portion of a semiconductor memory device and may be understood to explain the reduction in the delay odds of the delay replica circuit 260 shown in FIG. 8. Referring to FIG. 10, the DLL signal PDLL0 is provided to the delay replica circuit 260. The phase of the DLL signal PDLL0 is inverted through the inverter 227, and the inverted signal is divided. The latency signal LATENCY is generated using the latency control clock having a phase that precedes by ½ the cycle period of the external clock CLK, so that the latency signal LATENCY provided to the output unit 260 also has a preceding phase of 180°. Therefore, the amount of delay (and the corresponding number of inverter elements) provided to DLL signal PDLL0 by the delay replica circuit 260 may be reduced. The reduction in the amount of delay results in a reduction in the delay odds included in the delay replica circuit 260, thereby improving noise characteristics of the delay replica circuit 260 and also preventing excessive current from flowing through the delay replica circuit 260.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A column address strobe (CAS) latency circuit comprising:
   an internal read command signal generator configured to generate an internal read command signal in response to a read command;
   a latency control clock generator configured to generate a plurality of latency control clocks, at least one of the plurality of latency control clocks having an absolute margin with respect to the internal read command signal; and
   a latency signal generator coupled to the internal read command signal generator and the latency control clock generator, the latency signal generator configured to receive the internal read command signal and the plurality of latency control clocks, the latency signal generator further configured to generate a latency signal by shifting the internal read command signal based on the plurality of control clocks.

2. The circuit of claim 1, wherein the latency control clock generator is configured to generate at least one signal aligned to an external clock and delay the at least one signal by a predetermined phase.

3. The circuit of claim 2, wherein the predetermined phase depends on a phase difference between the external clock and the internal read command signal.

4. The circuit of claim 3, wherein the predetermined phase is less than the phase difference between the external clock and the internal read command signal.

5. The circuit of claim 1, wherein the latency control clock generator comprises:
   a delay locked loop (DLL) configured to receive an external clock and generate a DLL signal;
   a DLL replica coupled to the DLL and configured to generate at least one signal aligned to the external clock; and
   a PREAD replica coupled to the DLL replica and configured to receive the at least one signal aligned to the external clock, the PREAD replica further configured to delay the at least one signal aligned to the external clock by a predetermined phase depending on a phase difference between the external clock and the internal read command signal.

6. The circuit of claim 5, wherein the latency control clock generator further comprises a clock divider connected between the DLL and the DLL replica, the clock divider configured to divide the DLL signal into at least two division signals.

7. The circuit of claim 6, wherein the clock divider is configured to divide the DLL signal into an even division signal and an odd division signal.

8. The circuit of claim 7, wherein the DLL replica is configured to receive a selected one of the even division signal and the odd division signal.

9. The circuit of claim 8, wherein the latency control clock generator further comprises an odd/even splitter connected between the PREAD replica and the latency signal generator, the odd/even splitter configured to receive an output signal of the PREAD replica and generate a first even latency control clock and a first odd latency control clock.

10. The circuit of claim 9, wherein the latency control clock generator further comprises a delay block coupled to the clock divider, the delay block configured to receive the even and odd division signals, the delay block configured to delay each of the even and odd division signals and output 2nd through nth latency control clocks.

11. The circuit of claim 10, wherein the delay block comprises:
    a first delay block configured to delay the even division signal and generate 2nd through the nth even latency control clocks; and
    a second delay block configured to delay the odd division signal and generate 2nd through nth odd latency control clocks.

12. The circuit of claim 11, wherein the latency signal generator further comprises:

a first shift register unit configured to shift the internal read command signal using even latency control clocks, the even latency control clocks including the first even latency control clock and the $2^{nd}$ through nth even latency control clocks; and a second shift register unit configured to shift the internal read command signal using odd latency control clocks, the odd latency control clocks including the first odd latency control clock and the $2^{nd}$ through nth odd latency control clocks.

13. The circuit of claim 12, wherein the latency signal generator further comprises:
    a first adjusting unit coupled to the first shift register unit and configured to shift an output of the first shift register unit according to a CAS latency set value; and
    a second adjusting unit coupled to the second shift register unit and configured to shift an output of the second shift register according to the CAS latency set value.

14. The circuit of claim 13, wherein the latency signal generator further comprises a logic element coupled to receive output signals of the first adjusting unit and the second adjusting unit, the logic element further configured to output one of the received signals as the latency signal.

15. The circuit of claim 7, wherein the DLL replica comprises:
    a first DLL replica configured to receive the even division signal and generate one of the at least one signal aligned to the external clock; and
    a second DLL replica configured to receive the odd division signal and generate another one of the at least one signal aligned to the external clock.

16. The circuit of claim 15, wherein the PREAD replica comprises:
    a first PREAD replica coupled to the first DLL replica and configured to delay an output of the first DLL replica and generate the first even latency control clock; and
    a second PREAD coupled to the second DLL replica and configured to delay an output of the second DLL replica and generate the first odd latency control clock.

17. The circuit of claim 16, wherein the latency control clock generator further comprises a delay block coupled to the clock divider, the delay block configured to receive the even and odd division signals, the delay block configured to delay each of the even and odd division signals and output 2nd through nth latency control clocks.

18. The circuit of claim 17, wherein the delay block comprises:
    a first delay block configured to delay the even division signal and generate 2nd through the nth even latency control clocks; and
    a second delay block configured to delay the odd division signal and generate 2nd through nth odd latency control clocks.

19. The circuit of claim 18, wherein the latency signal generator further comprises:

a first shift register unit configured to shift the internal read command signal using even latency control clocks, the even latency control clocks including the first even latency control clock and the $2^{nd}$ through nth even latency control clocks; and a second shift register unit configured to shift the internal read command signal using odd latency control clocks, the odd latency control clocks including the first odd latency control clock and the $2^{nd}$ through nth odd latency control clocks.

20. The circuit of claim 19, wherein the latency signal generator further comprises:
    a first adjusting unit coupled to the first shift register unit and configured to shift an output of the first shift register unit according to a CAS latency set value; and
    a second adjusting unit coupled to the second shift register unit and configured to shift an output of the second shift register according to the CAS latency set value.

21. A semiconductor memory device comprising the column address strobe (CAS) latency circuit of claim 1.

22. A CAS latency circuit comprising:
    an internal read command signal generator configured to generate an internal read command signal in response to a read command;
    a latency control clock generator comprising a delay locked loop (DLL) configured to receive a first clock signal and generate a DLL signal, m-dividing (where "m" is an integer greater than or equal to 1) a signal obtained by controlling a phase of the DLL signal, and generating a plurality of latency control clocks based on the resulting m-divided signals; and
    a latency signal generator configured to receive the internal read command signal and the plurality of latency control clocks, the latency signal generator further configured to generate a latency signal based on the internal read command signal and the plurality of control clocks.

23. The circuit of claim 22, wherein the latency control clock generator m-divides the signal into two division signals obtained by controlling the phase of the DLL signal.

24. The circuit of claim 22, wherein the latency control clock generator m-divides the signal obtained by inverting the phase of the DLL signal.

25. The circuit of claim 22, wherein the latency control clock generator further comprises:
    a phase controller configured to control the phase of the DLL signal;
    a clock divider configured to divide the phase controlled signal;
    a DLL replica configured to receive the divided signals and generate a second clock signal aligned with the first clock signal; and
    a PREAD replica configured to receive the second clock signal and delay the second clock signal by a value related to a phase difference between the first clock signal and the internal read command signal.

* * * * *